US008110823B2

(12) United States Patent  
Bowers

(10) Patent No.: US 8,110,823 B2
(45) Date of Patent: Feb. 7, 2012

(54) III-V PHOTONIC INTEGRATION ON SILICON

(75) Inventor: John E. Bowers, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 287 days.

(21) Appl. No.: 11/534,560

(22) Filed: Sep. 22, 2006

(65) Prior Publication Data

US 2007/0170417 A1 Jul. 26, 2007

Related U.S. Application Data

(60) Provisional application No. 60/760,629, filed on Jan. 20, 2006, provisional application No. 60/795,064, filed on Apr. 26, 2006.

(51) Int. Cl.
*H01L 29/06* (2006.01)
(52) U.S. Cl. ............... 257/14; 257/22; 257/E33.008
(58) Field of Classification Search ............... 257/14, 257/E33.008
See application file for complete search history.

(56) References Cited

U.S. PATENT DOCUMENTS

| 6,074,892 | A | 6/2000 | Bowers et al. |
| 6,130,441 | A | 10/2000 | Bowers et al. |
| 6,147,391 | A | 11/2000 | Bowers et al. |
| 6,465,803 | B1 | 10/2002 | Bowers et al. |
| 7,535,089 | B2 * | 5/2009 | Fitzgerald ............... 257/684 |
| 2007/0189688 | A1 * | 8/2007 | Dehlinger et al. ............ 385/129 |
| 2007/0291808 | A1 * | 12/2007 | Ledentsov et al. ......... 372/50.11 |

OTHER PUBLICATIONS

Fang et al., "An optically pumped silicon evanescence laser," University of California Santa Barbara, ECE Department, Santa Barbara, CA 93106-9560, two pages.
Pack et al., "Silicon evanescent laser," University of California Santa Barbara, ECE Department, Santa Barbara, CA 93106-9560, six pages.
Bowers, "Optical gain and lasing on silicon," Department of Electrical and Computer Engineering, University of California, Santa Barbara, four pages.
Bowers, "Silicon evanescent laser," Department of Electrical and Computer Engineering, University of California, Santa Barbara, five pages.

* cited by examiner

*Primary Examiner* — Quoc Hoang
*Assistant Examiner* — Tony Tran
(74) *Attorney, Agent, or Firm* — Gates & Cooper LLP

(57) ABSTRACT

Photonic integrated circuits on silicon are disclosed. By bonding a wafer of III-V material as an active region to silicon and removing the substrate, the lasers, amplifiers, modulators, and other devices can be processed using standard photolithographic techniques on the silicon substrate. The coupling between the silicon waveguide and the III-V gain region allows for integration of low threshold lasers, tunable lasers, and other photonic integrated circuits with Complimentary Metal Oxide Semiconductor (CMOS) integrated circuits.

7 Claims, 12 Drawing Sheets

III-V PHOTONIC INTEGRATION ON SILICON

CROSS-REFERENCE TO RELATED APPLICATIONS

This application claims the benefit under 35 U.S.C. Section 119(e) of the following co-pending and commonly-assigned U.S. provisional patent applications:

Ser. No. 60/760,629, filed Jan. 20, 2006, entitled "OPTICAL GAIN AND LASING ON SILICON," by John E. Bowers, and Ser. No. 60/795,064, filed Apr. 26, 2006, entitled "III-V PHOTONIC INTEGRATION ON SILICON," by John E. Bowers, which applications are incorporated by reference herein.

BACKGROUND OF THE INVENTION

1. Field of the Invention

The present invention relates generally to semiconductor devices, and, more specifically, to integration of III-V optical devices with silicon substrates and circuits.

2. Description of the Related Art

Semiconductor chip level bonded devices have found uses in several consumer and commercial applications. Typically, semiconductor devices are made from a single type of material, or different types of material are grown onto a substrate based on lattice matching and compatible crystalline structures. Devices manufactured from III-V materials are typically grown on gallium arsenide or other compound semiconductor substrates. These devices are difficult to integrate with electronic devices fabricated on silicon.

However, there are many advantages to integrating electronic and photonic devices on a single substrate. Passive photonic devices such as arrayed waveguide routers (AWG) are commonly fabricated on silicon. Some active photonic devices have been demonstrated on silicon such as modulators and Raman lasers. However, most active photonic devices require single crystal material, which is difficult to grow on silicon because of the large lattice mismatch between the semiconductor with the proper bandgaps and silicon itself. The problem with the present discrete photonic devices is that the performance can be improved with integration, and the cost and size is much smaller. Silicon is a preferred semiconductor material, because it is easily processed, it is readily available for reasonable cost and high quality, and complex VLSI electronic circuits are readily available. However, silicon-based modulators or lasers or other photonic devices are not as efficient at light emission or absorption as their III-V based counterparts. It can be seen, then, that there is a need in the art for a larger scale integration between III-V materials and silicon.

SUMMARY OF THE INVENTION

To minimize the limitations in the prior art, and to minimize other limitations that will become apparent upon reading and understanding the present specification, the present invention provides a technology for making photonic integrated circuits on silicon. By bonding a wafer of III-V material as an active region to silicon and removing the substrate, the lasers, amplifiers, modulators, and other devices can be processed using standard photolithographic techniques on the silicon substrate. The coupling between the silicon waveguide and the III-V gain region allows for integration of low threshold lasers, tunable lasers, and other photonic devices and integrated circuits with Complimentary Metal Oxide Semiconductor (CMOS) integrated circuits.

A device in accordance with the present invention comprises a silicon layer resident on a first substrate, a III-V layer resident on a second substrate, the III-V layer being bonded to the silicon layer, wherein the second substrate is removed and the III-V layer and the silicon layer are processed to create the integrated device.

The device further optionally includes semiconductor layer resident on a third substrate, wherein the semiconductor layer is coupled to the III-V layer, the third substrate is removed, and the semiconductor layer, the III-V layer, and the silicon layer are processed to create the integrated device. Devices in accordance with the present invention can take many forms, such as modulators, amplifiers, in-plane or vertical cavity surface emitting lasers, photodetectors, where the device comprises at least one section selected from the group comprising detector pre-amplifier electronics, a laser, drive electronics, memory, and processing circuits, a silicon transponder, a silicon wavelength converter, a silicon tunable laser, a channel selector, and an optical buffer memory.

Another optical lasing device in accordance with the present invention comprises a silicon substrate, an oxide layer coupled to the substrate, a semiconductor layer, coupled to the oxide layer, wherein at least one waveguide is formed within the semiconductor layer, a spacer layer coupled to the semiconductor layer at an interface, a compound semiconductor layer, coupled to the semiconductor layer, and a bulk semiconductor layer, coupled to the compound semiconductor layer; wherein the compound semiconductor layer comprises at least one Quantum Well (QW) layer optically coupled to the at least one waveguide in an evanescent manner, and the spacer layer is bonded to the semiconductor layer.

Such an optical lasing device further optionally comprises the compound semiconductor layer further comprising at least one Separated Confinement Heterostructure (SCH) layer, the bulk semiconductor layer comprising a grating, the oxide layer further comprises a grating, and the at least one waveguide comprises a material selected from the group comprising air, silicon oxide, silicon oxynitride, and silicon nitride.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Figure 1:
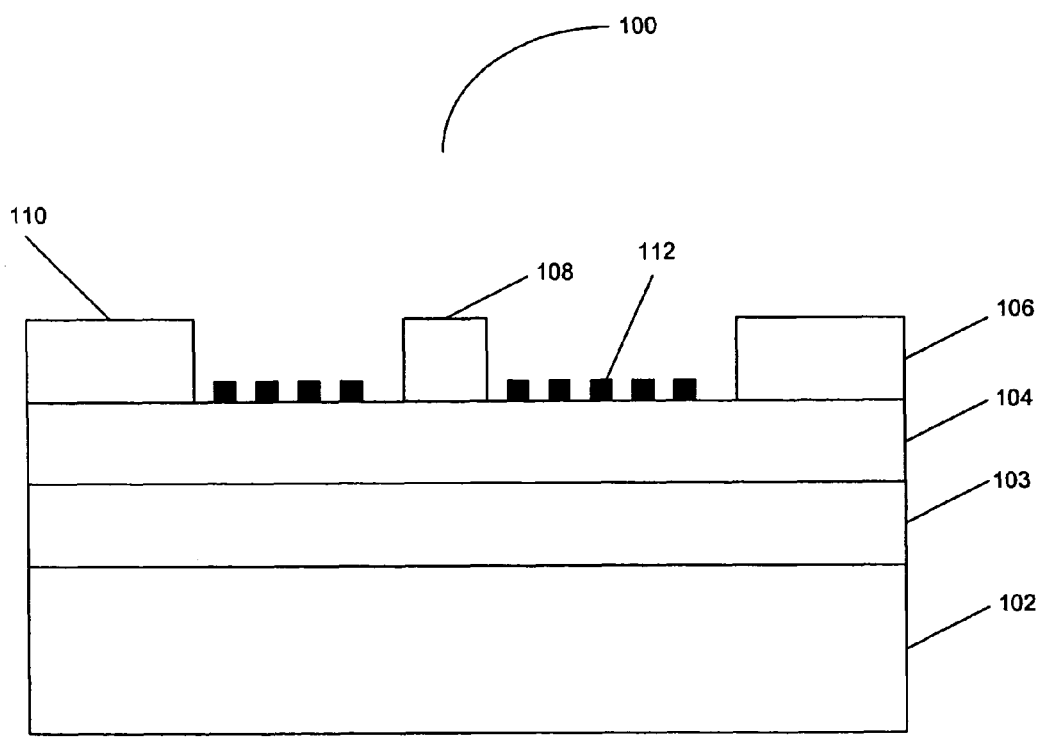
FIG. 1 is a side view of a photonic integrated circuit in accordance with the present invention.

FIG. 1 is a side view of a photonic integrated circuit in accordance with the present invention.

Device 100 is shown, with wafer 102, film 103, waveguide layer 104, modulator/mode converter 106, gain region 108, and photodetector 110 as shown. DBR reflector 112 are also shown.

Wafer 102 is typically a silicon CMOS wafer, but can be other materials, such as glass, as desired. Film 103 is typically silicon oxide, but can also be a nitride or silicon oxynitride if desired without departing from the scope of the present invention. Waveguide layer 104 is on film 103, and is the silicon waveguide layer for device 100. Modulator/mode converter 106, tunable laser 108, photodetector 110, and rib waveguides 112 are typically Indium Gallium Arsenide Phosphide (InGaAsP), but can be other materials, such as GaInAsN, or other III-V materials, without departing from the scope of the present invention.

A thin film of InGaAsP is deposited on a Semiconductor-On-Insulator (SOI) waveguide. This allows for evanescent coupling of the light in the SOI waveguide 104 to the quantum wells in the III-V material 108. DBR reflectors 112 are patterned for reflection within the waveguide.

Lateral Structure

Figure 2:
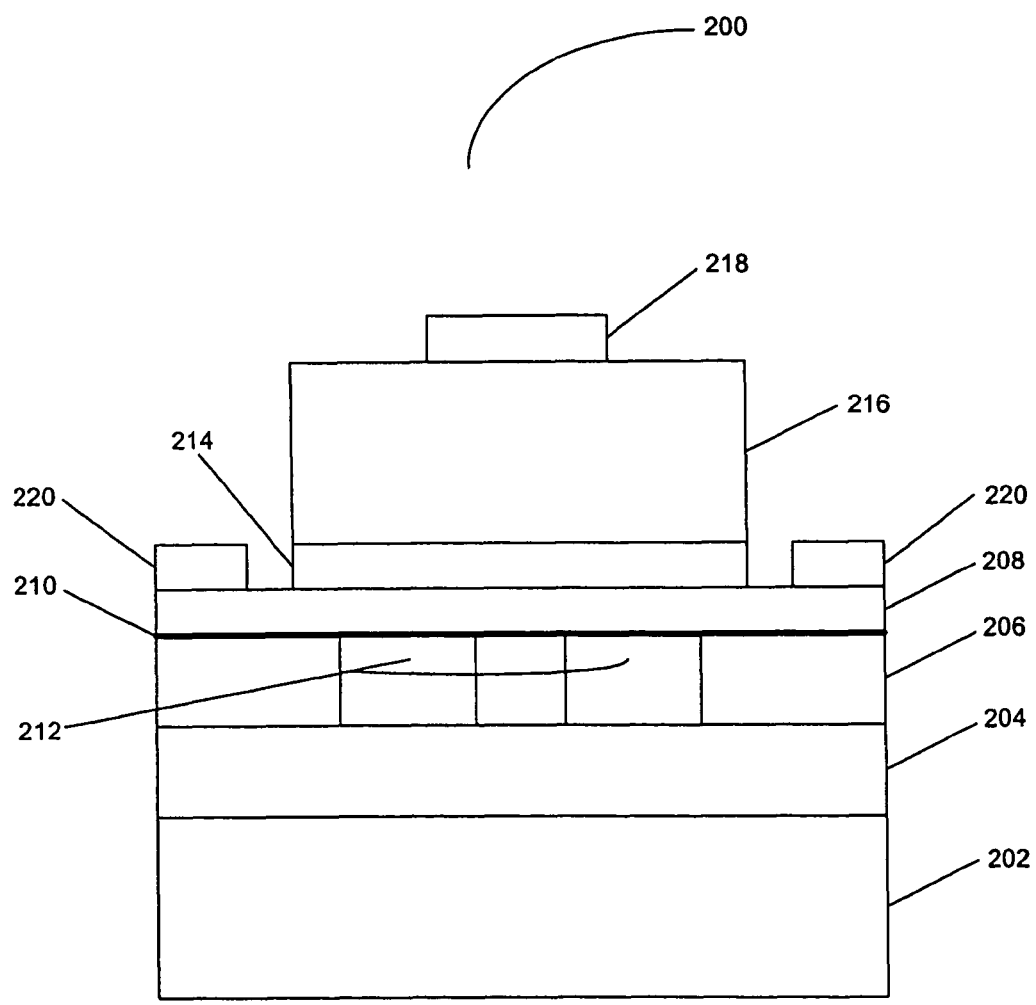
FIG. 2 illustrates a cross-sectional view of the offset quantum well gain region in accordance with the present invention.

FIG. 2 illustrates a cross-sectional view of the offset quantum well gain region in accordance with the present invention.

Device 200 comprises wafer 202, oxide layer 204, semiconductor layer 206, and spacer layer 208, which is bonded to semiconductor layer 206 at bonding interface 210. Within semiconductor layer 206 resides gaps 212, typically air gaps 212. On spacer layer 208 resides the quantum structure 214, and then bulk semiconductor layer 216. Contact 218 and contacts 220 are also shown.

Typically, wafer 202 is a silicon substrate, oxide layer 204 is silicon oxide, and semiconductor layer 206 is silicon, which together comprise a SOI structure. Gaps 212 form the sides of SOI waveguides. Gaps 212 (also known as cladding) can be air gaps, as well as refilled silicon oxide, silicon oxynitride, or silicon nitride, or other materials, without departing from the scope of the present invention. Further, the shape of gaps 212, when viewed from the top, can be linear, or in a circular or ring shape, or in other shapes, without departing from the scope of the present invention.

Spacer layer 208 is a semiconductor material, typically a III-V material, typically Indium Phosphide (InP), but can be other compound semiconductor materials if desired. The compound semiconductor layer 214 typically comprises a Multiple Quantum Well (MQW) layer and Separated Confinement Heterostructure (SCH) layers, as described in FIG. 3. Bulk semiconductor layer 216 is also typically InP, but can be other semiconductor materials, typically III-V semiconductor materials, without departing from the scope of the present invention.

Spacer layer 208 is typically bonded to semiconductor layer 206 at interface 210. The bonding technique used is described in the art, in, e.g., U.S. Pat. Nos. 6,074,892, 6,147,391, 6,130,441, and 6,465,803, which are incorporated by reference herein, and further described in the appendices attached to the present invention, which are incorporated by reference herein. Additional bonding to create additional layers are also possible within the scope of the present invention, which would create additional interfaces 210 within device 200.

Layer 216 may also comprise a grating which would create a distributed feedback laser within device 200, a grating in the oxide layer 204 to create a distributed Bragg reflector (DBR) laser, or other layers or components to create other optical lasing devices without departing from the scope of the present invention.

Figure 3:
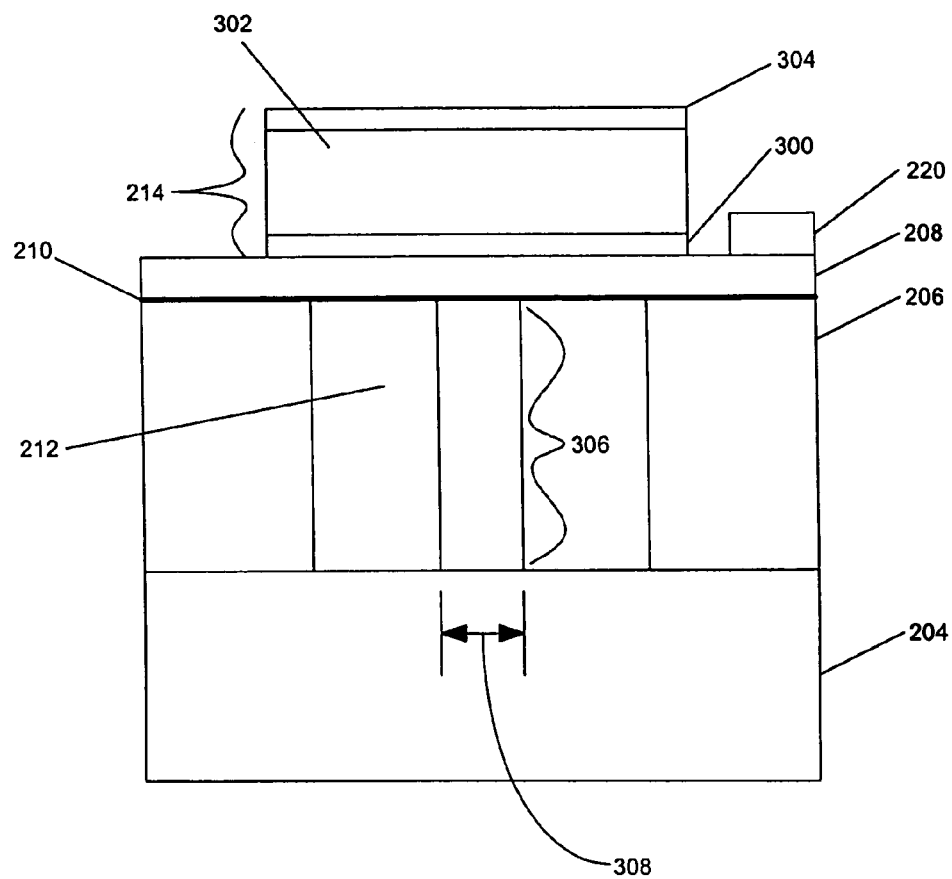
FIG. 3 illustrates another view of the quantum well region shown in FIG. 2 in accordance with the present invention.

FIG. 3 illustrates a detailed view of the quantum well region shown in FIG. 2 in accordance with the present invention.

Compound semiconductor region 214 comprises an SCH layer 300, a MQW layer 302, and an SCH layer 304. Typically, three to five quantum well layers are present in MQW layer 302, but a larger or smaller number of quantum well layers or bulk layers can be present without departing from the scope of the present invention. Further, the core portion of semiconductor layer 206 has a height 306 and a width 308, which dimensions determine the confinement factor of the device 200. Further, the thickness of each of the layers in the MQW layer 302 also play a part in the confinement factor for a device 200 made in accordance with the present invention.

Confinement Factor

Figure 4:
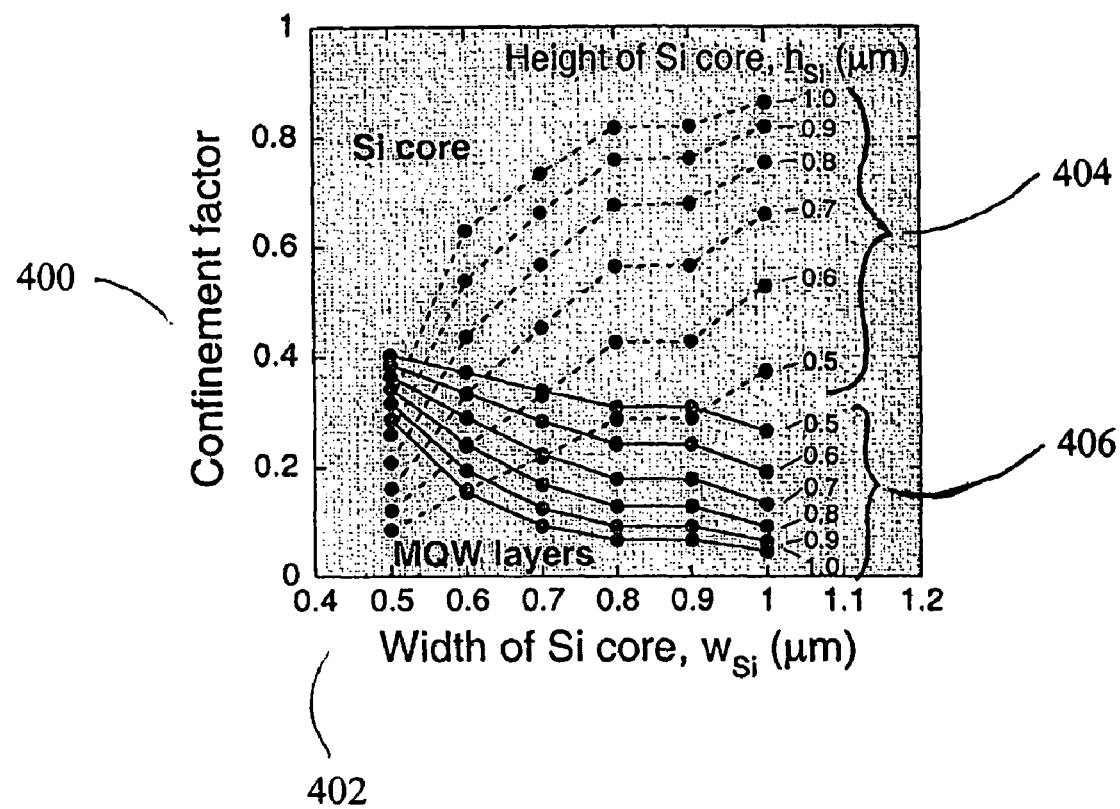
FIG. 4 illustrates the confinement factor versus the width and height of the silicon core in accordance with the present invention.

FIG. 4 illustrates the confinement factor versus the width and height of the silicon core in accordance with the present invention.

The graph of FIG. 4 shows the confinement factor 400 versus the width 308, shown on y-axis 402, of the silicon core portion of semiconductor layer 206. For a range of heights 306, the confinement factor of the silicon core, shown as lines 404, and for a range range of heights 306, the confinement factor 400 of the multiple quantum well region varies as a monotonic function of width 402. As the height of the core gets higher, the confinement factor 400 within the waveguide goes up; as the height of the core goes up, the confinement factor in the MQW layers 406 goes down.

Fabrication and Integration of Separate Devices

Typically, a chip-level bonding approach is used to bond one type of material to another. The chip-level bonding approach works well for discrete devices, however, alignment is typically an issue. There are some devices, such as integrated optical amplifiers, that are difficult to fabricate using a chip-level approach because of reflections at the interface between the III-V layer and the silicon substrate.

However, the present invention contemplates using a wafer-level bonding approach, where a III-V wafer is bonded to a silicon wafer, the III-V substrate is removed, and the III-V layers are then processed into various types of devices.

Figure 5:
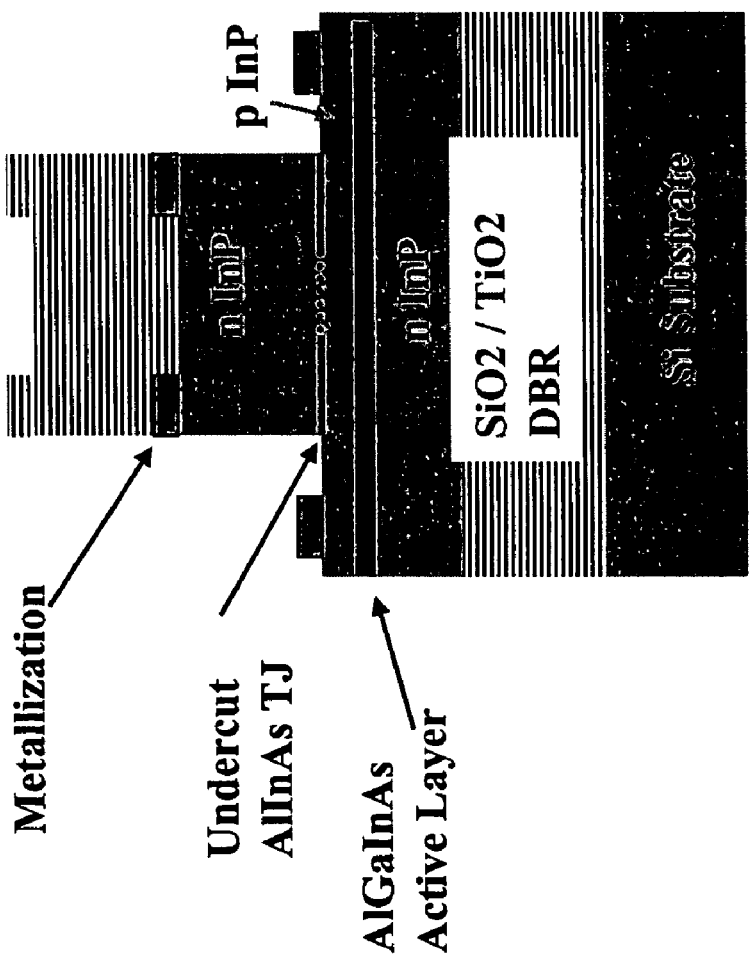
FIG. 5 illustrates a device manufactured in accordance with the present invention.

FIG. 5 illustrates a device manufactured in accordance with the present invention.

FIG. 5 illustrates a SiO2/Si Distributed Bragg Reflector (DBR) bonded to AlGaInAs quantum wells for a Vertical Cavity Surface Emitting Laser (VCSEL).

Figure 6:
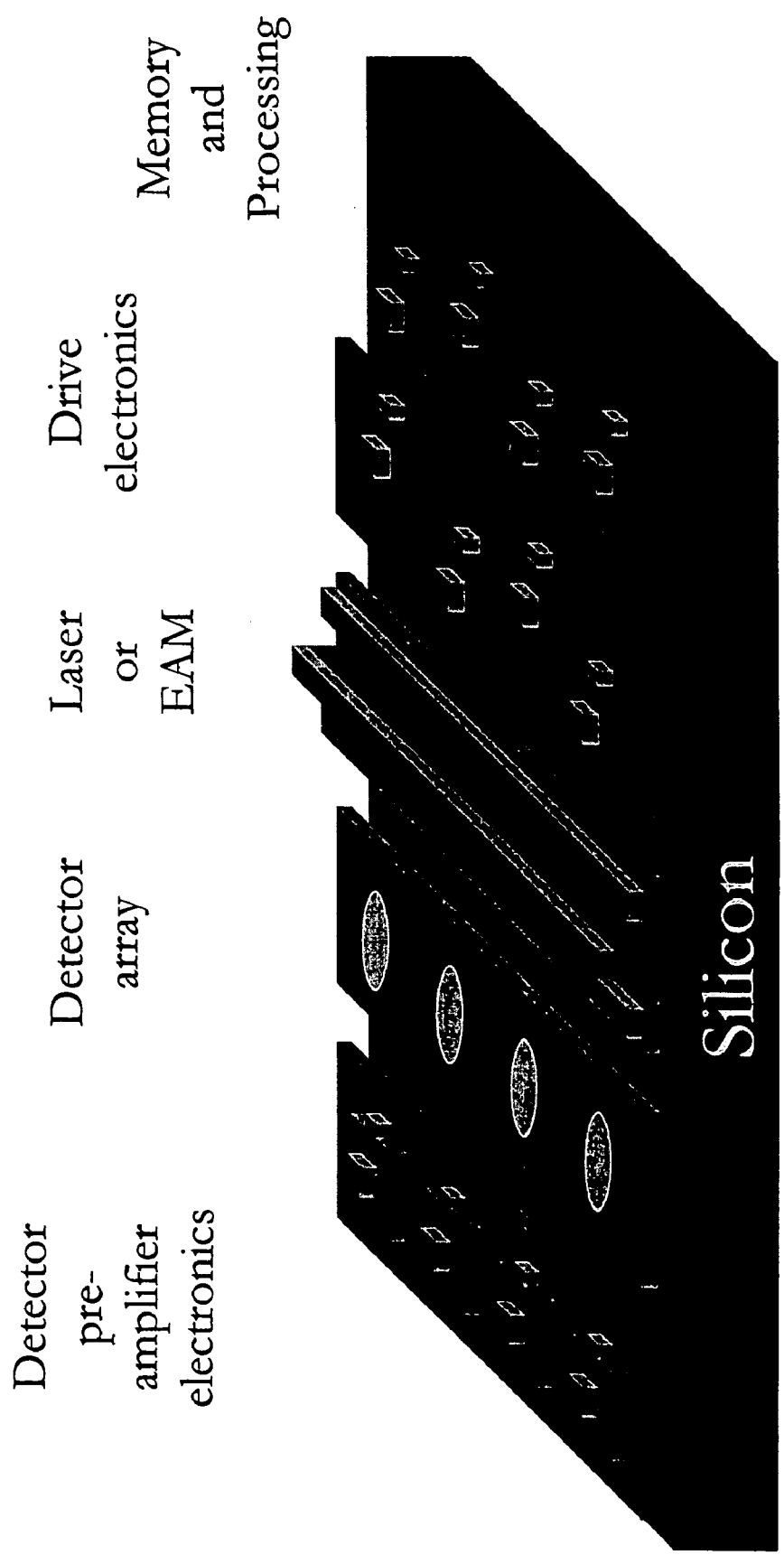
FIG. 6 illustrates a processed chip with different devices on a single wafer in accordance with the present invention.

FIG. 6 illustrates a processed chip with different devices on a single wafer in accordance with the present invention.

As shown in FIG. 6, many different types of devices can be integrated on a single wafer or chip using the process of the present invention. For example, detector pre-amplifier electronics, the detector array, a laser or modulator, drive electronics, and memory/processing circuits can now all reside on a single piece of semiconductor substrate, because the qualities of the silicon that are desirable, e.g., avalanche gain, is now electrically bonded to a material that is a better absorber than silicon.

Figure 7:
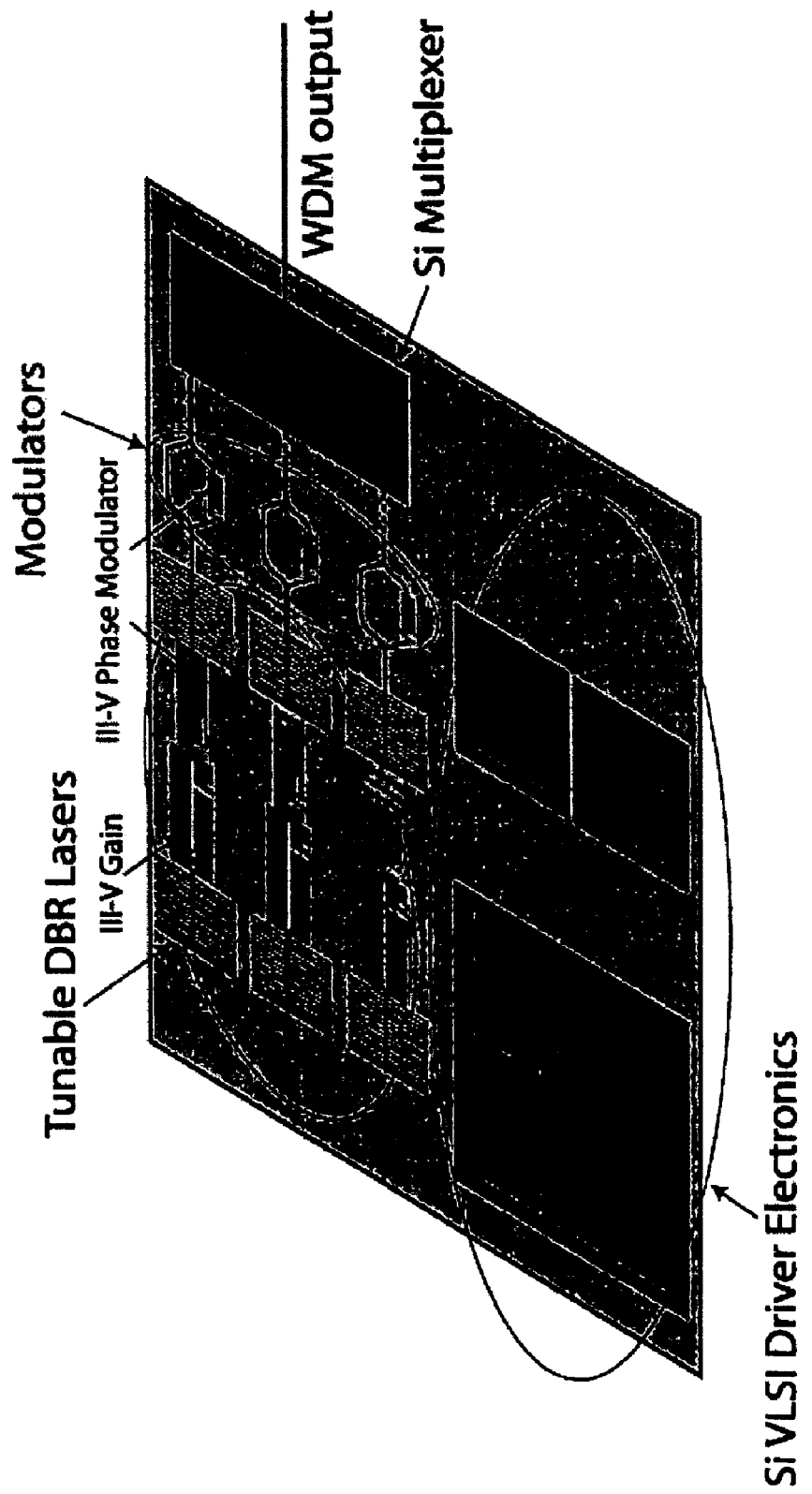
FIG. 7 illustrates a silicon transponder in accordance with the present invention.

FIG. 7 illustrates a silicon transponder in accordance with the present invention.

As shown in FIG. 7, where the III-V material is better suited to perform a specific circuit task, the material is used in that location on the circuit to provide that function. For example, and not by way of limitation, silicon is used in the multiplexer and driver electronics, but the III-V material is used in the gain portion of the tunable DBR laser and the phase modulator portions of the transponder. Such an approach allows for integration of the entire circuit, rather than fiber coupled die or using printed circuit boards, ball grid arrays, or other approaches to integrate the various components of the transponder.

Figure 8:
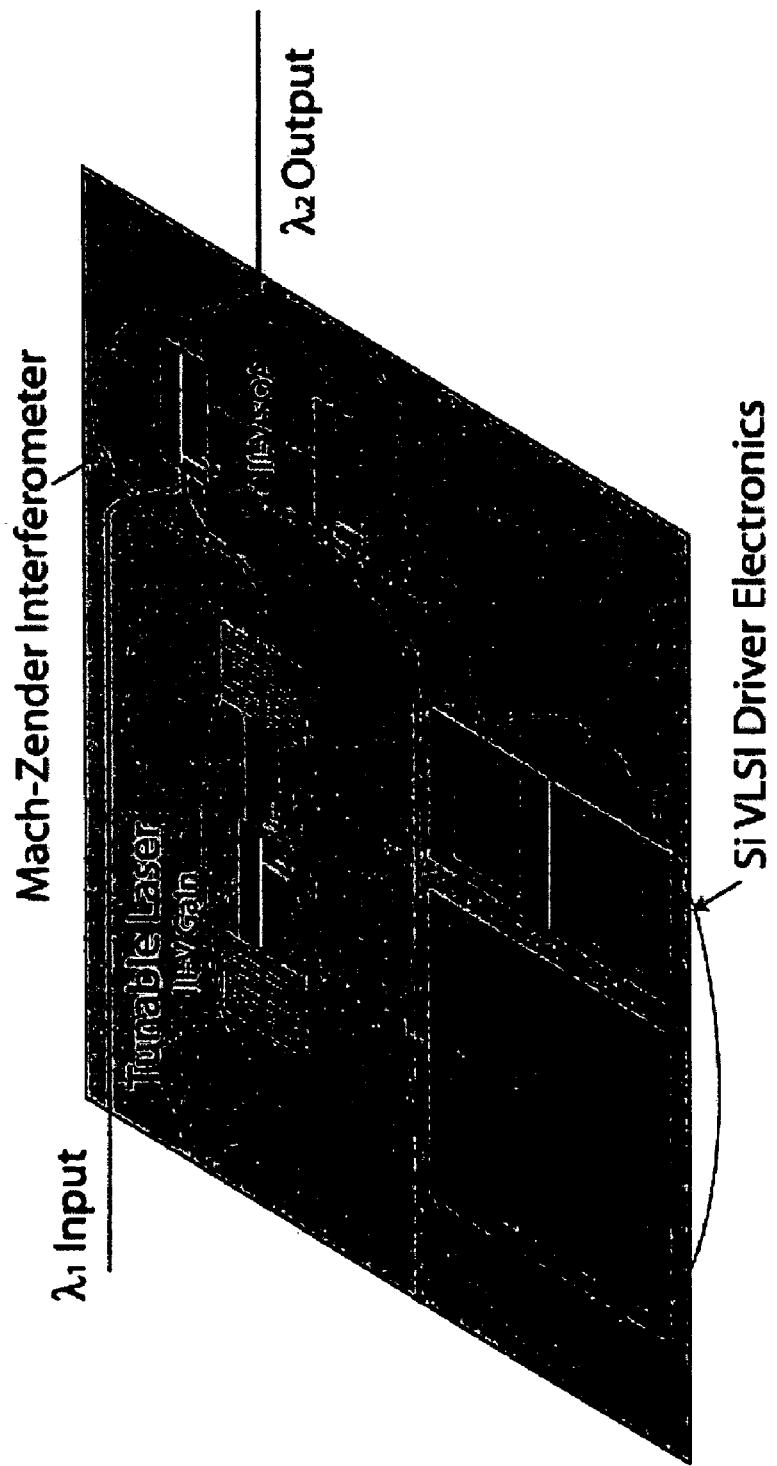
FIG. 8 illustrates a silicon wavelength converter in accordance with the present invention.

FIG. 8 illustrates a silicon wavelength converter in accordance with the present invention. Again, the tunable laser and the SOA use III-V materials, whereas the silicon is used for the VLSI driver electronics, which provides an integrated device on a single semiconductor surface rather than using components to create the wavelength converter device.

Figure 9:
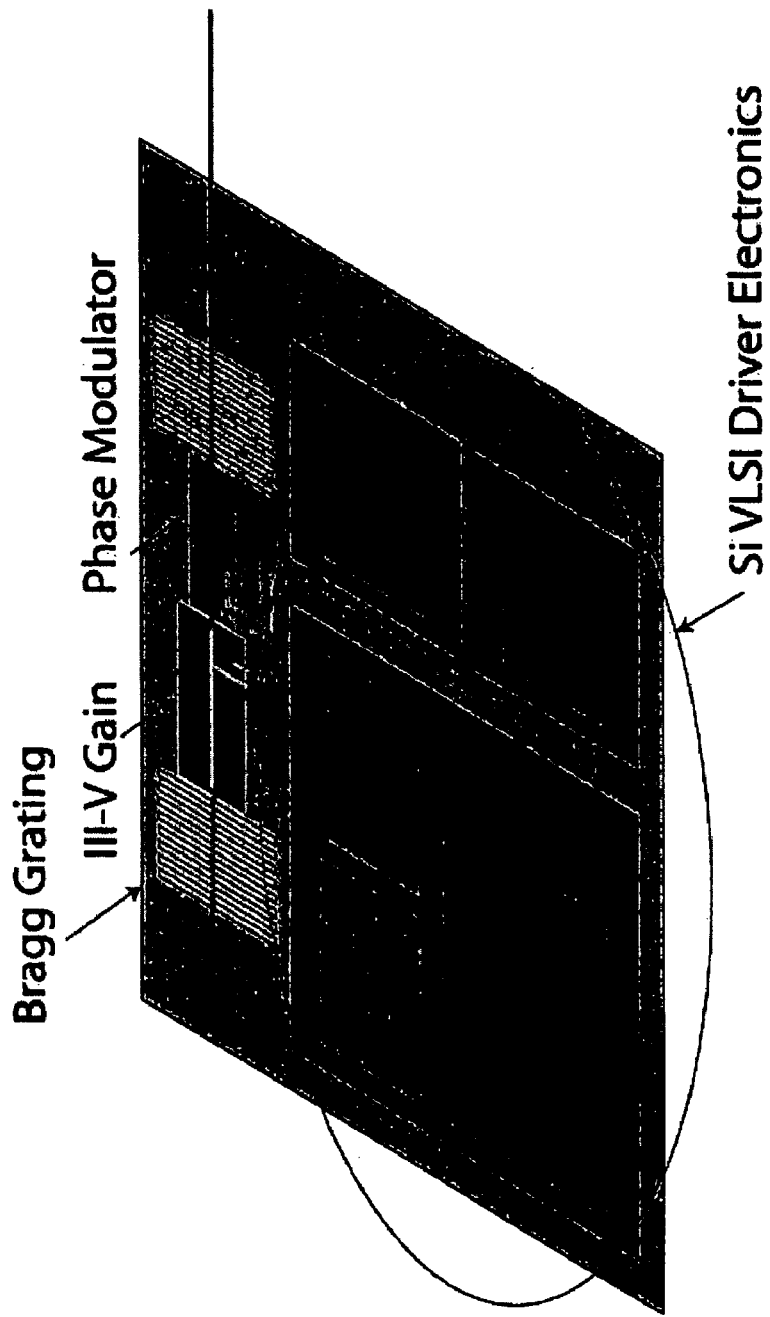
FIG. 9 illustrates a silicon tunable laser in accordance with the present invention.

FIG. 9 illustrates a silicon tunable laser in accordance with the present invention. Again, the III-V material is used for the gain portion of the laser, while silicon is used for the driver electronics.

Figure 10:
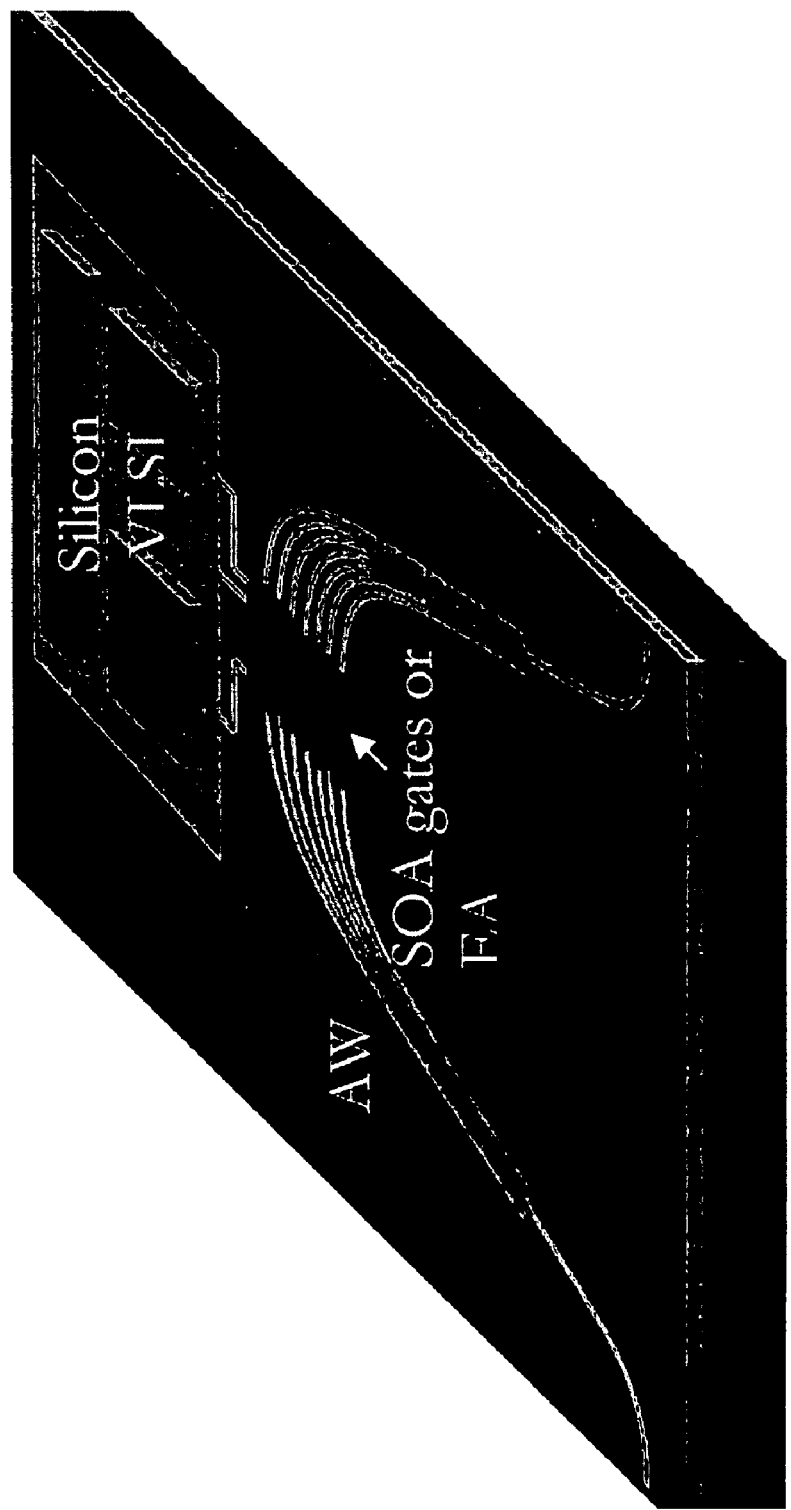
FIG. 10 illustrates a channel selector/WDM modulator structure in accordance with the present invention.

FIG. 10 illustrates a channel selector/WDM modulator structure in accordance with the present invention.

The channel selector and the SOA use III-V materials, whereas the silicon is used for the VLSI driver electronics, which provides an integrated device on a single semiconductor surface rather than using components.

Figure 11:
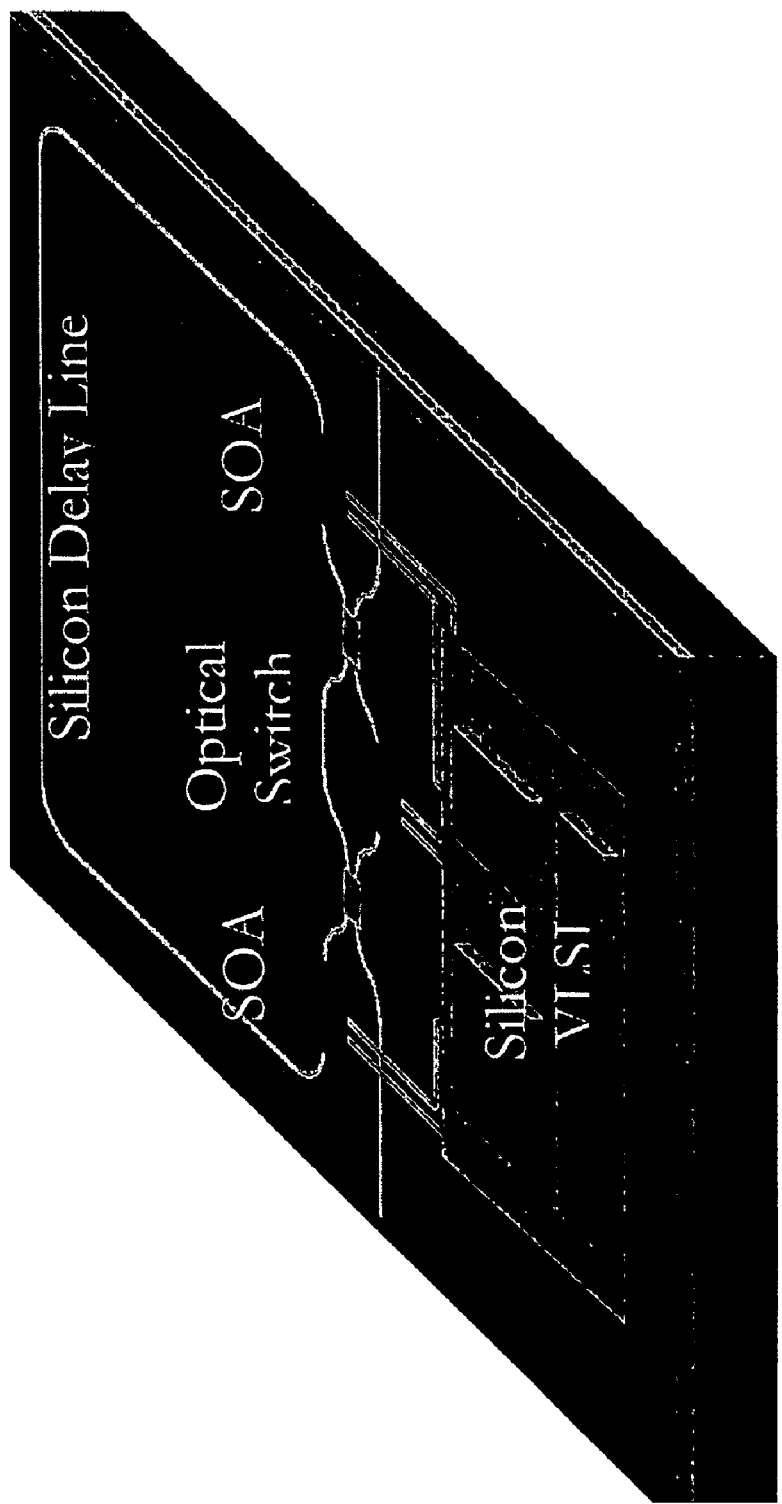
FIG. 11 illustrates an optical buffer memory structure in accordance with the present invention.

FIG. 11 illustrates an optical buffer memory structure in accordance with the present invention.

Figure 12:
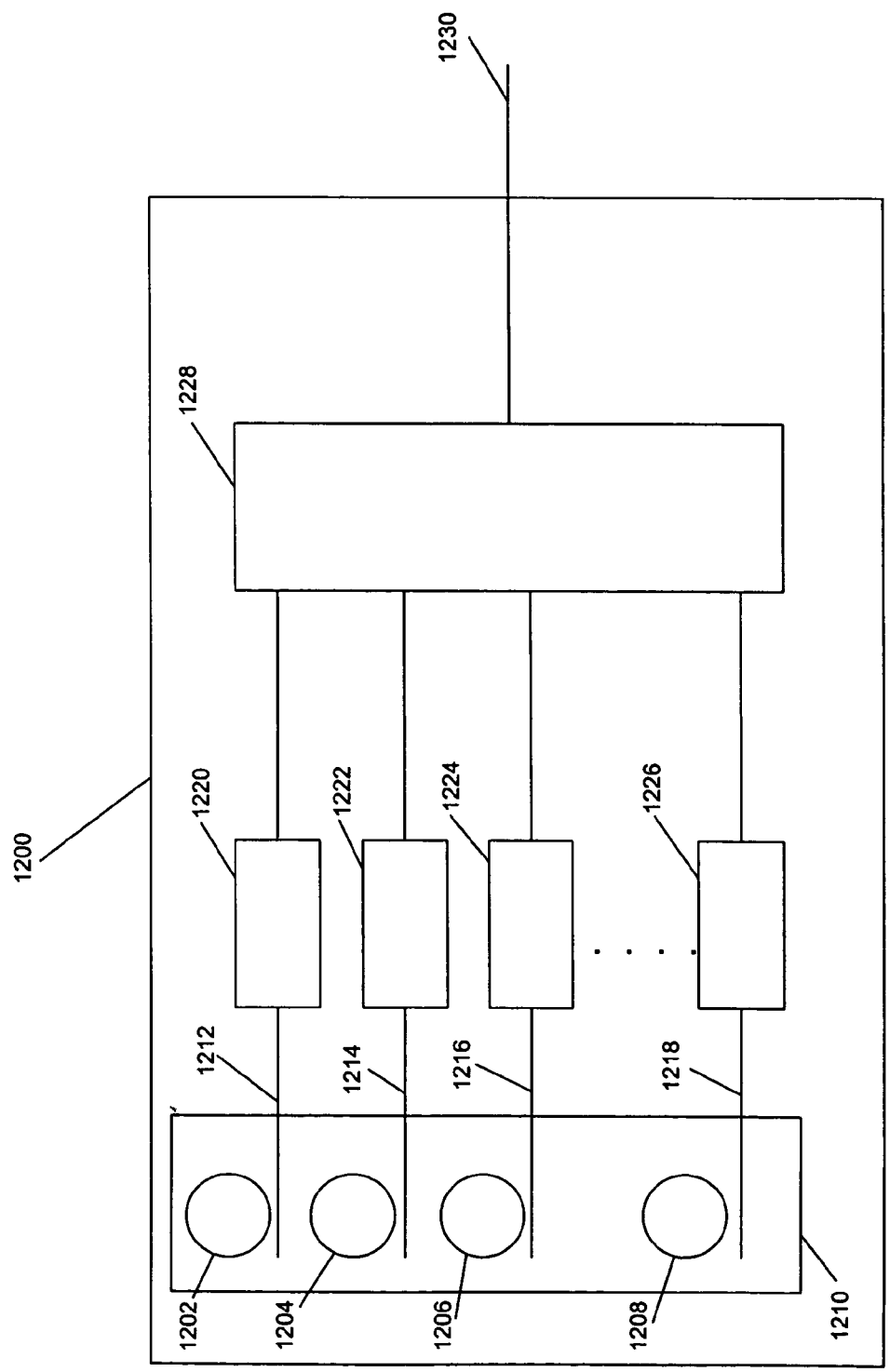
FIG. 12 illustrates an integrated silicon transmitter photonics chip in accordance with the present invention.

FIG. 12 illustrates an integrated silicon transmitter photonics chip in accordance with the present invention.

Chip 1200 comprises ring lasers 1202-1208, which are evanescent lasers. Each ring laser 1202-1208 can produce different wavelengths if desired. Ring lasers 1202-1208 have their waveguides resident in chip 1200, which is typically silicon, and the gain region in the bonded region 1210, which is typically a III-V material.

Ring lasers 1202-1208 are then coupled to SOI waveguides 1212-1218 respectively, which are coupled to modulators 1220-1226. Modulators 1220-1226 are resident in the chip 1200, which, again, is typically silicon, but can be other materials without departing from the scope of the present invention.

Modulators 1220-1226 are then coupled via SOI waveguides to multiplexer 1228, which has an output 1230. Output 1230 comprises a signal which contains all of the wavelengths produced by ring lasers 1202-1208. Additional circuitry can be provided to selectively eliminate one or more of the ring lasers 1202-1208 wavelengths from being included in output 1230.

As seen in FIG. 12, the evanescent coupling of the present invention can be performed at the wafer level, partial wafer level, or die level, depending on the application or desired device, which provides for selective integration of III-V materials or other materials with a silicon platform.

CONCLUSION

In summary, embodiments of the invention provide methods and for making an optical device on silicon. The present invention can be used for lasers, modulators, amplifiers, and photodetectors, and devices that use combinations of these devices, such as wavelength converters, channel selectors, 3R regenerators, buffer memories, etc.

A device in accordance with the present invention comprises a a silicon layer resident on a first substrate, a III-V layer resident on a second substrate, the III-V layer being bonded to the silicon layer, wherein the second substrate is removed and the III-V layer and the silicon layer are processed to create the integrated device.

The device further optionally includes semiconductor layer resident on a third substrate, wherein the semiconductor layer is coupled to the III-V layer, the third substrate is removed, and the semiconductor layer, the III-V layer, and the silicon layer are processed to create the integrated device.

Devices in accordance with the present invention can take many forms, such as a vertical cavity surface emitting laser, a photodetector, where the photodetector comprises at least one section selected from the group comprising detector pre-amplifier electronics, a laser, drive electronics, memory, and processing circuits, a silicon transponder, a silicon wavelength converter, a silicon tunable laser, a channel selector, and an optical buffer memory.

Another optical lasing device in accordance with the present invention comprises a silicon substrate, an oxide layer coupled to the substrate, a semiconductor layer, coupled to the oxide layer, wherein at least one waveguide is formed within the semiconductor layer, a spacer layer coupled to the semiconductor layer at an interface, a compound semiconductor layer, coupled to the semiconductor layer, and a bulk semiconductor layer, coupled to the compound semiconductor layer; wherein the compound semiconductor layer comprises at least one Multiple Quantum Well (MQW) layer optically coupled to the at least one waveguide in an evanescent manner, and the spacer layer is bonded to the semiconductor layer.

Such an optical lasing device further optionally comprises the compound semiconductor layer further comprising at least one Separated Confinement Heterostructure (SCH) layer, the bulk semiconductor layer comprising a grating, the oxide layer further comprises a grating, and the at least one waveguide comprises a material selected from the group comprising air, silicon oxide, silicon oxynitride, and silicon nitride.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims attached hereto and the full breadth of equivalents to the claims.

What is claimed is:
1. A lasing device, comprising:
    a Silicon-On-Insulator (SOI) structure comprising a silicon substrate, wherein a silicon layer within the SOI structure comprises a passive waveguide and a silicon core having a height and a width; and a semiconductor structure comprising a Group III-V material and a hybrid waveguide, the semiconductor structure bonded to the silicon layer of the SOI structure wherein a lattice mismatch exists between the semiconductor structure layer and the SOI structure layer at the bond, wherein light in the passive waveguide is evanescently coupled to the hybrid waveguide in the semiconductor structure, wherein the SOI structure further comprises a grating.

2. The lasing device of claim 1, wherein the height of the silicon core is varied from 0.5 to 1.0 microns.

3. The lasing device of claim 1, wherein a thickness of the silicon core is varied from 0.4 to 1.2 microns.

4. A lasing device, comprising:
- a silicon substrate;
- an oxide layer comprising a grating coupled to the substrate;
- a silicon layer, coupled to the oxide layer, wherein at least one passive waveguide is formed within the silicon layer;
- a spacer layer coupled to the silicon layer at an interface;
- a compound semiconductor layer comprising at least one Separate Confinement Heterostructure (SCH) layer and a hybrid waveguide, coupled to the spacer layer; and
- a bulk semiconductor layer, coupled to the compound semiconductor layer; wherein the compound semiconductor layer comprises at least one Quantum Well (QW) layer in the hybrid waveguide optically coupled to the at least one passive waveguide in an evanescent manner, and the spacer layer is bonded to the silicon layer wherein a lattice mismatch exists between the spacer layer and the silicon layer at the bond.

5. The lasing device of claim 4, wherein a waveguide cladding, coupled to the waveguide, comprises a material selected from the group comprising air, silicon oxide, silicon oxynitride, and silicon nitride.

6. A lasing device, comprising:
- a Silicon-On-Insulator (SOI) structure comprising a silicon substrate, wherein a silicon layer within the SOI structure comprises a passive waveguide and a silicon core having a height and a width; and
- a semiconductor structure comprising a Group III-V material and a hybrid waveguide, the semiconductor structure bonded to the silicon layer of the SOI structure wherein a lattice mismatch exists between the semiconductor structure layer and the SOI structure layer at the bond, wherein light in the passive waveguide is evanescently coupled to the hybrid waveguide in the semiconductor structure, wherein the semiconductor structure further comprises a grating.

7. A lasing device, comprising:
- a silicon substrate;
- an oxide layer coupled to the substrate;
- a silicon layer, coupled to the oxide layer, wherein at least one passive waveguide is formed within the silicon layer;
- a spacer layer coupled to the silicon layer at an interface;
- a compound semiconductor layer comprising at least one Separate Confinement Heterostructure (SCH) layer and a hybrid waveguide, coupled to the spacer layer; and
- a bulk semiconductor layer comprising a grating, coupled to the compound semiconductor layer; wherein the compound semiconductor layer comprises at least one Quantum Well (QW) layer in the hybrid waveguide optically coupled to the at least one passive waveguide in an evanescent manner, and the spacer layer is bonded to the silicon layer wherein a lattice mismatch exists between the spacer layer and the silicon layer at the bond.

* * * * *